(12) United States Patent
Chen et al.

(10) Patent No.: US 6,242,314 B1
(45) Date of Patent: Jun. 5, 2001

(54) METHOD FOR FABRICATING A ON-CHIP TEMPERATURE CONTROLLER BY CO-IMPLANT POLYSILICON RESISTOR

(75) Inventors: Shui-Hung Chen, Hsin-chu; Chrong Jung Lin, Hsin-Tien; Jiaw-Ren Shih, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/161,407

(22) Filed: Sep. 28, 1998

(51) Int. Cl.[7] .................................................. H01L 21/20
(52) U.S. Cl. ........................................ 438/384; 438/514
(58) Field of Search .................................. 438/382, 384, 438/385, 238, 210, 514, 941

(56) References Cited

U.S. PATENT DOCUMENTS

| | | | |
|---|---|---|---|
| 4,298,401 | 11/1981 | Nuez et al. | 148/1.5 |
| 4,602,421 | * 7/1986 | Lee et al. | 29/576 C |
| 4,679,170 | * 7/1987 | Bourassa et al. | 365/154 |
| 4,707,909 | * 11/1987 | Blanchard | 437/109 |
| 4,762,801 | 8/1988 | Kapoor | 437/24 |
| 5,037,766 | 8/1991 | Wang | 437/24 |
| 5,489,547 | 2/1996 | Erdeljac et al. | 437/60 |
| 5,622,884 | * 4/1997 | Liu | 438/238 |

OTHER PUBLICATIONS

Lee et al, On the semi–insulating polycrystalline silicon resistor, Solid State Electronics, vol. 27, No. 11, pp. 995–1001, 1984.*

* cited by examiner

*Primary Examiner*—David Nelms
*Assistant Examiner*—Quoc Hoang
(74) *Attorney, Agent, or Firm*—George O. Saile; Stephen B. Ackerman; William J. Stoffel

(57) ABSTRACT

A method of manufacturing a on-chip temperature controller by co-implanting P-type and N-type ions into poly load resistors. The N and P type implant dose can be selected to create the desired cut-off temperature. First, a polysilicon layer 30 is formed on a first insulation layer 20. The polysilicon layer 30 is patterning to form a first poly-load resistor 30A and a second poly-load resistor 30B. The first and the second poly-load resistors are connected to a temperature sensor circuit 12. Both p-type and n-type impurity ions are implanted into the polysilicon layer 30. An insulating dielectric layer 40 is formed over the polysilicon layer 30 and the first insulating layer 20. The polysilicon layer is annealed. The contact openings 44 are formed through the ILD dielectric layer 40 exposing portions of the polysilicon layer 30. Contacts 50 to the polysilicon layer 30 thereby forming a first and second poly-load resistors which are used a temperature on-chip sensors. The first and second poly-load resistors can have different implant dose to get the desired cut off temperatures.

20 Claims, 5 Drawing Sheets

METHOD FOR FABRICATING A ON-CHIP TEMPERATURE CONTROLLER BY CO-IMPLANT POLYSILICON RESISTOR

BACKGROUND OF THE INVENTION

1) Field of the Invention

This invention relates generally to fabrication of polysilicon resistors for semiconductor devices and particularly to the fabrication of a resistor with both p-type and N-type doping and more particularly to an On-chip temperature controller having polysilicon load resistors that have both p-type and N-type doping by a ion co-implant process.

2) Description of the Prior Art

As the device dimensions decrease and the packing density increases, the power dispassion becomes a major consideration in circuit operation. In the future, the on-chip temperature sensor to detect and control temperature variation will become more important.

For the traditional power transistor, the large current flow and high operation voltage will also increase temperature rapidly, which can damage the power device and decrease the lifetime of the circuit. It important that the resistor have a low temperature coefficient (i.e., low change in resistivity with temperature change).

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 4,298,401 (Nuez) that shows a breakdown voltage resistor obtained through a double ion-implantation (Both same conductivity resistor) into a semiconductor substrate.

U.S. Pat. No. 4,762,801 (Kapoor) shows an amorphous poly resistor and I/I an impurity to give the resistor the proper Temp coefficients.

U.S. Pat. No. 5,037,766 (Wang) shows a poly resistor treated with an Oxygen treatment.

U.S. Pat. No. 5,489,547 (Erdeljac) shows a method of fabricating semiconductor device having polysilicon resistor with low temperature coefficient.

However, the temperature coefficient's of poly load resistors can be further improved.

SUMMARY OF THE INVENTION

It is an object of the present invention to provide a method for fabricating a resistor in an on-chip temperature sensor that has an easily controllable cut off temperature.

It is an object of the present invention to provide a method for fabricating a resistor in an on-chip temperature sensor that has an easily controllable resistivity that allows exact temperature cut off s point to be defined in a temperature controller.

It is an object of the present invention to provide a method for fabricating a resistor in a on-chip temperature sensor that has a easily controllable cut off temperature which is low cost and simple to manufacture.

It is an object of the present invention to provide a method for fabricating a resistor with both P and N type implanted impurities in a on-chip temperature sensor that has a easily controllable cut off temperature.

To accomplish the above objectives, the present invention provides a method of manufacturing an on-chip temperature controller including the steps of: forming a first insulation layer 20 over a semiconductor structure 10. Next, we form a polysilicon layer 30 on the first insulation layer 20. The polysilicon layer 30 is patterning to form a first poly-load resistor and a second poly-load resistor. The first and the second poly-load resistors are connected to a temperature sensor circuit 12. Both p-type and n-type impurity ions are implanted into the polysilicon layer 30.

An insulating (e.g., interlevel dielectric (ILD)) dielectric layer 40 is formed over the polysilicon layer 30 and the first insulating layer 20.

The polysilicon layer is rapid thermal anneal the polysilicon layer at a Temperature in a range of between about 900 and 1100° C. for a time in a range of between about 10 and 20 seconds. The polysilicon layer 30 preferably has a n-type impurity ion concentration in a range of between about 1E18 and 1E19 atoms/cm$^3$ and a p-type impurity ion concentration in a range of between about 5E17 and 5E18 atoms/cm$^3$; and the polysilicon layer having sheet resistance in a range of between about 1 Meg ohm and 1 Gig-ohm and TC temperature coefficient in a range of between about −20 and 200.

The contact openings 44 if formed through the ILD dielectric layer 40 exposing portions of the polysilicon layer 30.

Contacts 50 to the polysilicon layer 30 thereby forming a first and second poly-load resistors which are used a temperature on-chip sensors, the first and second poly-load resistors have different implant dose to get the desired cut off temperatures.

Benefits

The present invention provides the following benefits:
1) The invention's N and P impurity co-implant, the poly-load resistor resistance can be controlled to achieve the desired cut off temperature.
2) The invention's poly-load resistor only occupies a small area and will allow dense packing.

The co-implant affects the temperature coefficient of the resistors as shown in the FIGS. 5 & 6. The different doses have different cross over points. The designer can use these as parameters. The co-implanted poly-load resistors have low temperature coefficient.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming a polysilicon resistor having both N and P impurities implanted for a on-chip temperature sensor or controller.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well know processes have not been described in detail in order to not unnecessarily obscure the present invention.

It should be recognized that many publication describe the details of common techniques used in the fabrication process of integrate circuit component. Those techniques can be generally employed in the fabrication of the structure of the present invention. Moreover, the individual steps of such a process can be performed using commercially available integrate circuit fabrication machines. As specifically necessary to than understanding of the present invention, exemplary technical data are set forth based upon current technology. Future developments in the art may call for appropriate adjustments as would be obvious to one skilled in the art.

The table below summarized the major elements of the invention.

Figure 7:
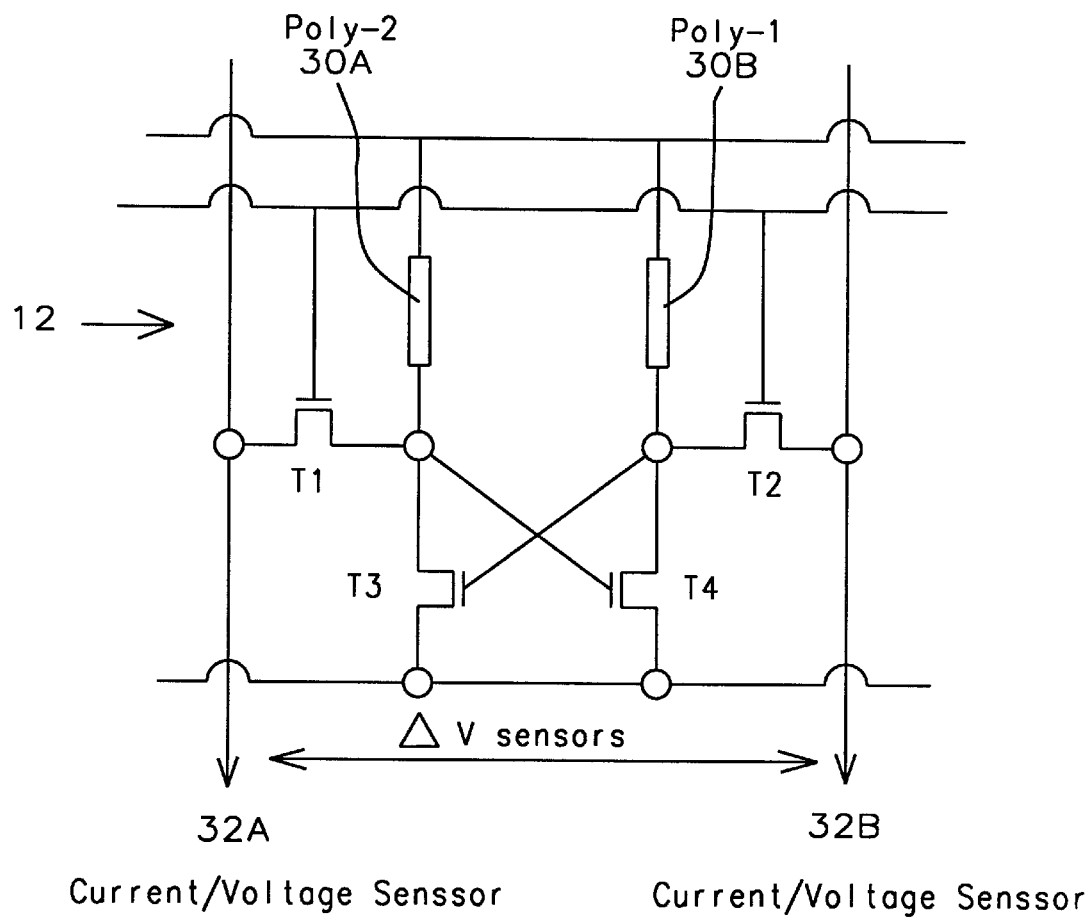
FIG. 7 is a schematic of a novel temperature sensor circuit 12 having the invention's poly-load 30A 30B resistors.

| Element no. | Table of elements<br>Generic Name |
|---|---|
| 10 | Semiconductor structure |
| 12 | Temperature Sensor Circuit - FIG. 7 |
| 20 | First insulating layer |
| 30 | Polysilicon layer |
| 30A | First poly-load resistor |
| 30B | Second poly-load resistor |
| 40 | IDL dielectric layer |
| 44 | Contact opening |
| 50 | Contacts |
| T1 and T2 | First and second transistors |
| T3 and T4 | Third and fourth transistors |
| 32A and 32B | Current/voltage sensor leads |
| ΔV sensor | ΔV between voltage sensor leads 32A and 32B. |

FIG. 7 shows an example of a novel temperature sensor circuit 12 where the N and P implanted poly load resistors of the present invention are used. FIG. 7 shows a new application for a SRAM not used before. The invention's co-implanted poly resistors be used in other temperature sensor/control circuits.

The temperature controller/sensor can be connected to an amplifier or monitor/recorder to an on/off switch. The resistors 30A 30B sense current - temperature changes.

The resistors 30A 30B in the circuit functions as sense current - temperature change.

CO-IMPLANT PROCESS AND STRUCTURE—FIGS. 1 TO 4

Figure 1:
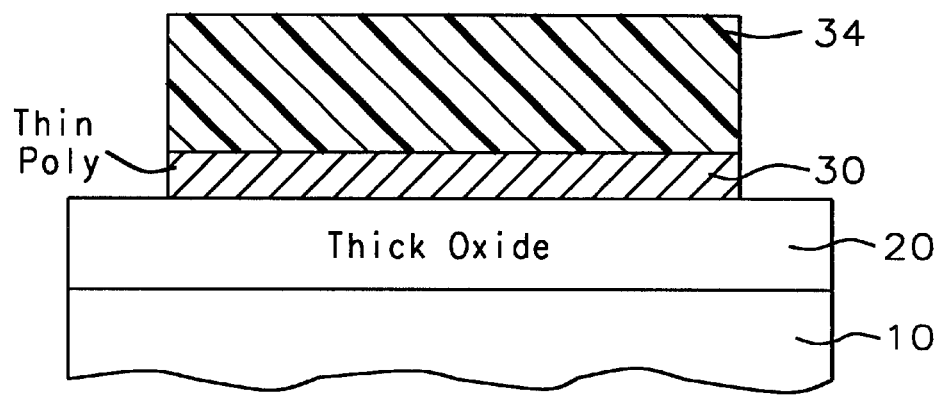
FIGS. 1 through 4 are cross sectional views for illustrating a method for manufacturing a temperature sensing circuit with co-implanted resistors according to the present invention.

As shown in FIG. 1, the method for forming an on-chip chip temperature sensor using two poly-load resistors begins by forming a first insulation layer 20 over a semiconductor structure 10.

Semiconductor structure 10 is understood to possibly include a semiconductor wafer, active and passive devices formed within the wafer and insulating and conductive layers formed on or over the wafer surface. The term "semiconductor structure surface" is meant to include the upper most exposed layers over a semiconductor wafer, such as a silicon surface, an insulating layer and metallurgy lines, etc.

The first insulation layer 20 has a thickness in a range of between about 1000 and 4000 Å and more preferably about 1500 Å. The insulating layer is preferably an inter-poly oxide (IPO) layer.

Still referring to FIG. 1, a polysilicon layer 30 is formed on the first insulation layer 20. The polysilicon layer 30 preferably has a thickness in a range of between about 300 and 1500 Å and more preferably about 550 Å.

Preferably the polysilicon layer 30 is not insitu doped. The preferred Polysilicon process is an LPCVD process. The polysilicon layer can be deposited by prolyzing silane in a low pressure chemical vapor deposition process at 620 C.

As shown in FIG. 1, the polysilicon layer 30 is patterned to form a first poly-load resistor 30A and a second poly-load resistor 30B. The first and the second poly-load resistors 30A and 30B are connected to a temperature sensor circuit 12. See FIG. 7. The polysilicon layer 30 is patterned using a photoresist layer (not shown) as a mask and is etched through openings in the photoresist layer.

CO-IMPLANT OF POLY-RESISTORS

Figure 2:
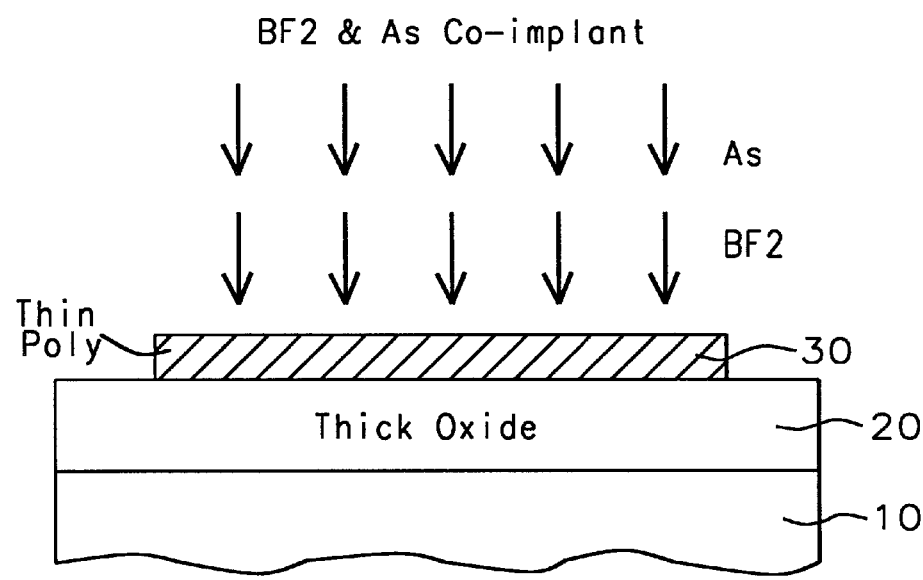

As shown in FIG. 2, both p-type and n-type impurity ions are implanted into the polysilicon layer 30.

Both the first and second poly-load resistors 30A 30B are co-implanted at the same time.

Depending on the desired parameters, the first 30A and second 30B poly-load resistors 30A 30B can be implanted with the same or different As Implant doses.

The resistors can receive different N-type (e.g., As) and p-type (e.g., B) doses. For example, the poly load can both receive the same As doses, but receive different B doses. For examples see FIG. 5 where the poly loads received 2 different B doses. Likewise the poly loads can both receive the same p-type (B) doses, but receive different n-type (As) doses.

Photoresist layer(s) can be used to cover one poly-load resistor during the PI/I (ion implant) of the other poly-load resistor.

TABLE

An Example Of A Co-Implant Process - both resistors get same N-type I/I doses but different P-type I/I doses 1 I/I N type impurities into both the first and second resistors 30A 30B
2 form photoresist layer covering the second poly-load
3 I/I P ions into the first poly-load resistor 30A
4 from second photoresist layer covering the first poly-load resistor
5 I/I P ions into the second poly-load resistor 30B The tables below show co-implant processes for a poly load thickness for about 500 Å thickness.

| Preferred implantation parameters first and second poly-load resistor 30A 30B are implanted with N-type ions | | | | |
|---|---|---|---|---|
| | units | Low | tgt | Hi |
| Implant Energy | Kev | 10 | 45 | 70 |
| dose | atom/cm² | 3E13 | 5E13 | 9E13 |
| ion type (e.g., As, P) | | As or P | As or P | As or P |
| Ion-single or double ionized | | | Single | |
| Sheet resistance After RTA | | | M-ohm to G-ohms | |

TABLE

| Preferred implantation parameters for the P-type implant for load resistor 1 & 2 - 30A and 30B | | | | |
|---|---|---|---|---|
| | units | Low | tgt | hi |
| Implant Energy | Kev | 10 | 30 | 50 |
| Dose | atom/cm² | 5E12 | 3E13 | 7E13 |
| ion type (e.g., BF₂, B) | | BF₂ or B | BF₂ or B | |

The co-implant makes it easier to obtain the correct cut off temperature

Figure 3:
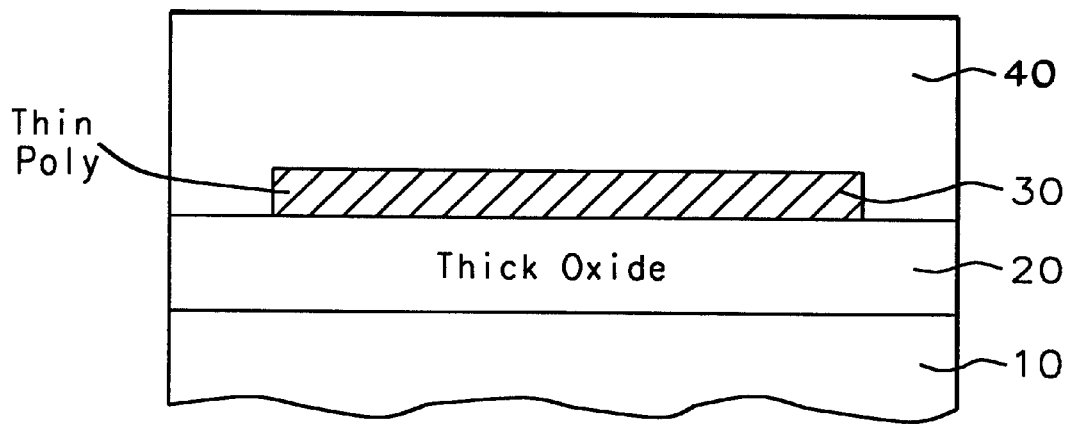

As shown in FIG. 3, an ILD dielectric layer 40 is formed over the polysilicon layer 30 and the first insulating layer 20. The ILD dielectric layer 40 is preferably composed of silicon oxide, Silicon oxynitride or silicon nitride, and preferably has a thickness in a range of between about 1000 and 4500 Å.

The polysilicon layer is now preferably rapid thermal annealed at a Temperature in a range of between about 700 and 1100° C. for a time in a range of between about 10 and 60" (seconds) preferably in an inert gas such as Ar or N.

After the rapid thermal anneal, the polysilicon layer 30 preferably has a n-type impurity ion concentration in a range of between about 1E13 and 9E13 atoms/cm³ and a p-type impurity ion concentration in a range of between about 5E12 and 8E17 atoms/cm³.

The first poly - load resistor 30A and second poly - load resistors 30B preferably have a n-type impurity ion implanted dose in a range of between about 1E13 and 9E13 atoms/cm² and a p-type impurity implanted dose in a range of between about 5E12 and 8E17 atoms/cm²; and a resistivity in a range of between about 1 M-ohms and 1 G-Ohms.

Figure 8:
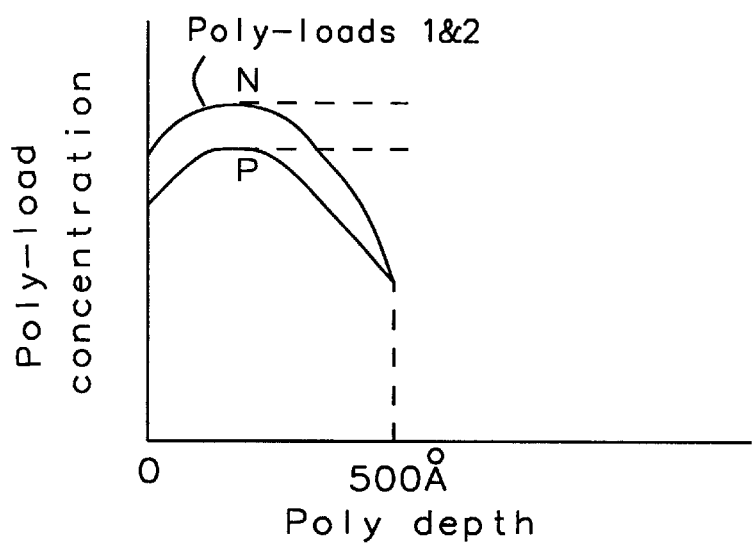
FIG. 8 is an approximation of the P and N impurity concentration profiles in a resistor according to the present invention.

FIG. 8 is a graph showing the inventor's estimate of the p-type impurity profile and N-type impurity profile as a function of Poly depth for both the first and second poly-load resistors. This curve is not based on actual data.

Figure 4:
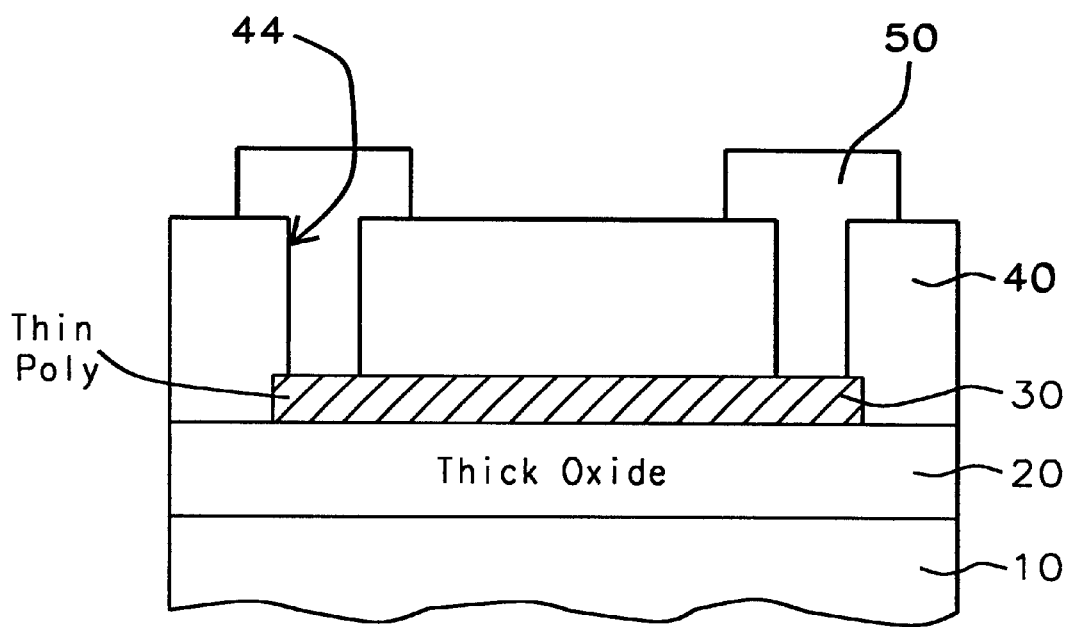

FIG. 4 shows the formation of contact openings 44 through the ILD dielectric layer 40 exposing portions of the polysilicon layer 30.

Contacts 50 are formed to the polysilicon layer 30 thereby forming a first and second poly-load resistors which are used a temperature on-chip sensors. The first and second poly-load resistors can have different implant doses to obtain the desired cut off temperatures.

TEMPERATURE SENSOR CIRCUIT—FIG. 7

FIG. 7 shows a novel Temperature sensor/controller circuit. FIG. 7 is a novel SRAM circuit modified as a temperature sensor. The current differential on the poly load circuits poly 1 and poly 2 (Delta V sensor) allows the sensing of the temperature. The table above describes the major elements for FIG. 7. The temperature control circuit shown on FIG. 7 can be an on-chip temperature controller.

FIG. 7 is a schematic of the temperature sensor circuit 12 having the invention's poly-load 30A 30B resistors. The temperature sensor generates and uses a differential voltage that is obtained across the source/drain regions of two compatible FET transistors T1 and T2 having dissimilar resistivity polysilicon load resistors 30A 30B. The differential voltage between sensor lines 32A and 32B is proportional to the temperature and may be sampled by an A/D converter to obtain a digital count indicative of the temperature of the microprocessor.

CUT-OFF TEMPERATURE AS A FUNCTION OF CO-IMPLANT DOSE

Figure 5:
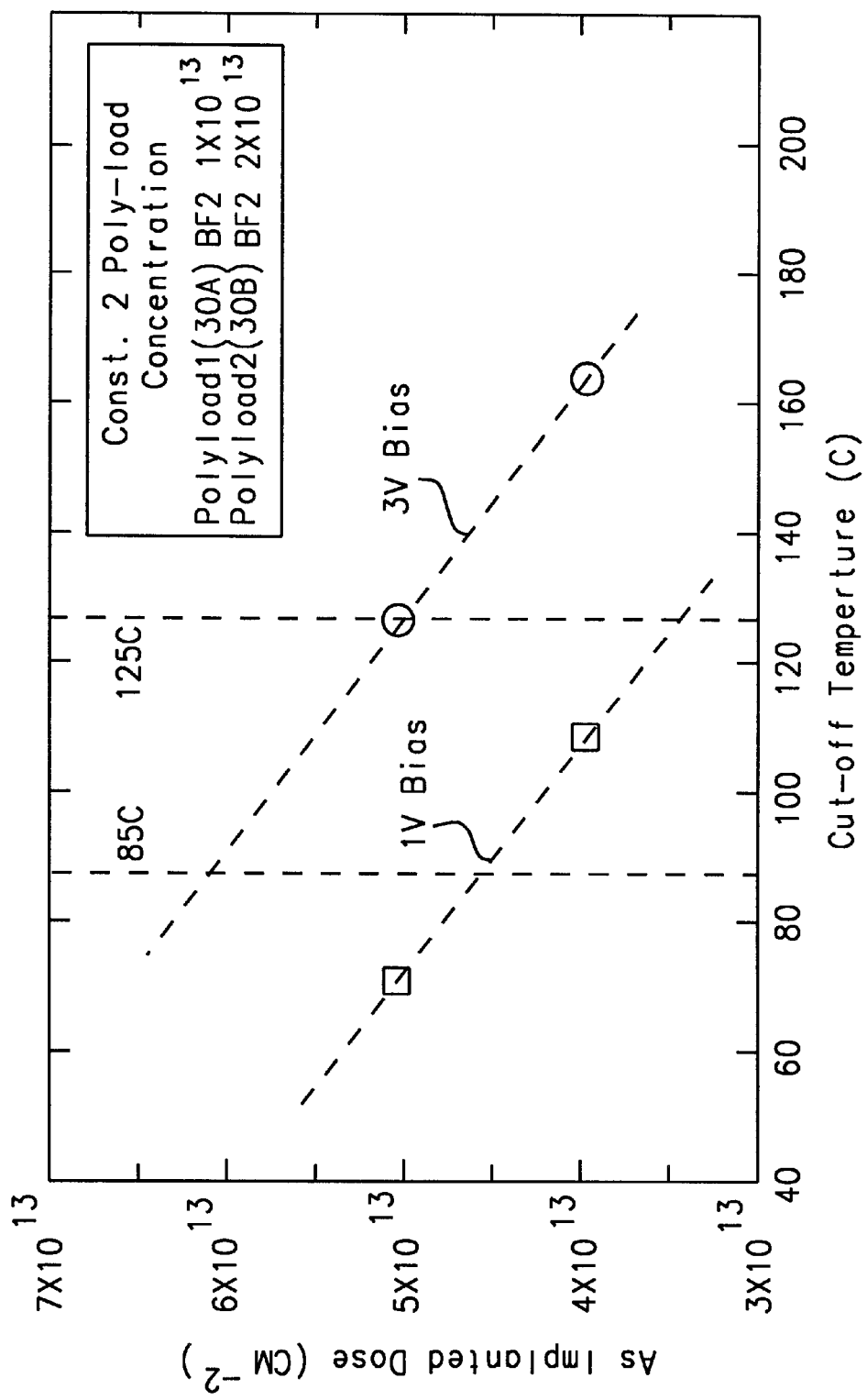
FIG. 5 is a graph of the cut off temperature as a function of As Implanted dose at two n-type implant doses and 2 bias voltages.

FIG. 5 shows a graph that allows the correct p and N implant parameters to be selected for the first and second poly load resistors. FIG. 5 is a graph of the cut off temperature as a function of As Implanted dose at two N-type implant doses and at 2 different bias voltages.

Figure 6:
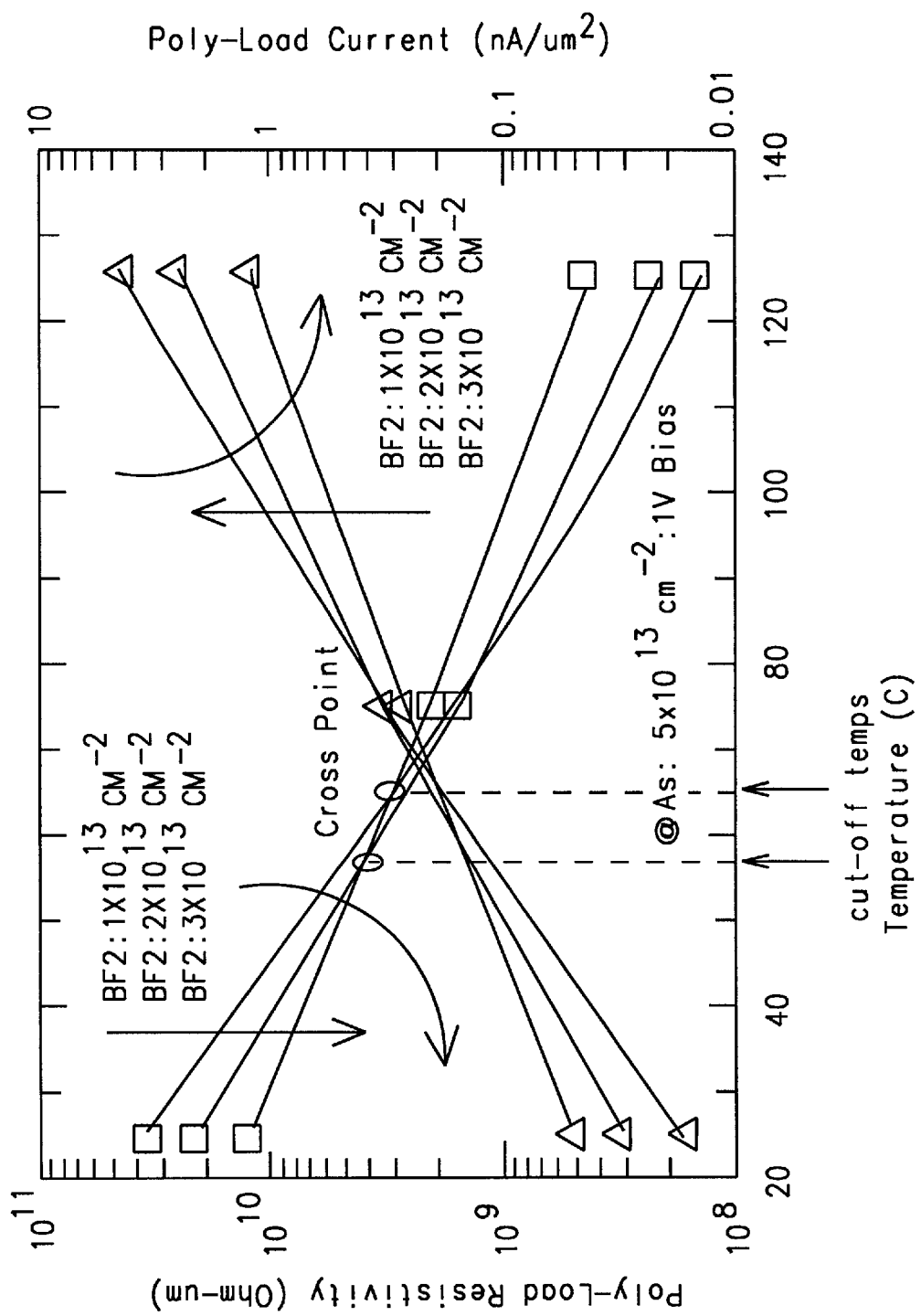
FIG. 6 is a graph of the cutoff temperature as a function of poly-load resistivity for three BF$_2$ dose levels.

FIG. 6 is a graph of the cutoff temperature as a function of poly-load resistivity for three $BF_2$ dose levels. FIG. 6 shows that the cut off temperature depends on the I/I doses of the poly load resistors.

BENEFITS OF INVENTION

The present invention provides the following benefits:

1) The invention's N and P impurity co-implant, the poly-load resistor resistance can be controlled to achieve the desired cut off temperature.

2) The invention's poly-load resistor only occupies a small area and will allow dense packing.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a temperature controller by co-implantation of poly resistors; comprising the steps of:
    a) forming a first insulating layer over a semiconductor structure;
    b) forming a polysilicon layer on said first insulation layer;
    c) patterning said polysilicon layer to form a first poly-load resistor and a second poly-load resistor;
    d) implanting both p-type and n-type impurity ions into the entire top surface said first poly-load resistor and said second poly-load resistor; whereby the doses of said p-type and n-type impurity ions implantations are selected to obtain a cut-off desired temperature;
    e) forming an dielectric layer over said first poly-load resistor, said second poly-load resistor, and said first insulating layer;
    f) annealing said first poly-load resistor and said second poly-load resistor;
    g) forming contact openings through said dielectric layer exposing portions of said first poly-load resistor said second poly-load resistor; and
    h) forming contacts to said polysilicon layer thereby completely forming said first poly-load resistor, and said second poly-load resistor.

2. The method of claim 1 wherein said polysilicon layer having a thickness in a range of between about 300 and 1000 Å.

3. The method of claim 1 wherein said first poly-load resistor and said second poly load resistor receive the same implant n-type impurity doses and the same P-type impurity ion doses.

4. The method of claim 1 wherein said first poly-load resistor and said second poly load resistor receive the same implant n-type impurity ion doses and different P-type impurity ion doses.

5. The method of claim 1 wherein said first poly-load resistor and said second poly load resistor receive the same implant p-type impurity ion doses and different n-type impurity ion dose.

6. The method of claim 1 wherein the said first poly-load resistor and said second poly-load resistor are part of an on-chip temperature sensor means fabricated on the same chip for monitoring the temperature of the chip.

7. The method of claim 1 wherein said first insulation layer having a thickness in a range of between about 1000 and 4000 Å.

8. The method of claim 1 wherein the implanting of said p-type impurity ions comprises implanting $BF_2$ ions at an energy in a range of between about 10 and 50 Kev, and a dose in a range of between about 5E12 and 8e13 and the implanting of said n-type ion comprised implanting As ion at an energy in a range of between about 10 and 60 Kev and a dose in a range of between about 1E13 and 9E13 atoms/$cm^2$.

9. The method of claim 1 wherein said polysilicon layer having a n-type impurity ion concentration in a range of between about 1E18 and 1E19 atoms/$cm^3$ and a p-type impurity ion concentration in a range of between about 1E17 and 1E19 atoms/$cm^3$.

10. The method of claim 1 wherein said polysilicon layer is Rapid thermal annealed at a Temperature in a range of between about 700 and 1100° C. for a time in a range of between about 10 second and 60 seconds.

11. The method of claim 1 wherein said polysilicon layer having sheet resistance in a range of between about 1 M-ohm and 1 G-ohm.

12. A method of fabricating an on-chip temperature controller by co-implant poly resistor; comprising the steps of:
  a) forming a first insulating layer over a semiconductor structure;
  b) forming a polysilicon layer on said first insulation layer;
  c) patterning said polysilicon layer to form a first poly-load resistor and a second poly-load resistor;
  d) implanting both p-type and n-type impurity ions into the entire top surface of said first poly-load resistor and said second poly-load resistor; whereby the doses of said p-type and n-type impurity ions implantations are selected to obtain a desired cut-off temperature; the implanting of said p-type impurity ions comprises implanting $BF_2$ ions at an energy in a range of between about 10 and 50 Kev, and a dose in a range of between about 5E12 and 8E13 and the implanting of said n-type ion comprised implanting As ion at an energy in a range of between about 10 and 60 Kev and a dose in a range of between about 1E13 and 9E13 atoms/$cm^2$;
  e) forming an dielectric layer over said first poly-load resistor, said second poly-load resistor, and said first insulating layer;
  f) rapid thermal annealing said first poly-load resistor said second poly-load resistor at a temperature in a range of between about 700 and 1100° C. for a time in a range of between about 10 second and 60 seconds;
  g) forming contact openings through said dielectric layer exposing portions of said first poly-load resistor and said second poly-load resistor; and
  h) forming contacts to first poly-load resistor and said second poly-load resistor thereby completing making said first poly-load resistor and said second poly-load resistor.

13. The method of claim 12 wherein said first insulation layer having a thickness in a range of between about 1000 and 4000 Å.

14. The method of claim 12 wherein said first poly-load resistor and said second poly load resistor receive the same implant n-type impurity doses and the same P-type impurity ion doses.

15. The method of claim 12 wherein said first poly-load resistor and said second poly load resistor receive the same implant n-type impurity ion doses and different P-type impurity ion doses.

16. The method of claim 12 wherein said first poly-load resistor and said second poly load resistor receive the same implant p-type impurity ion doses and different n-type impurity ion doses.

17. The method of claim 12 wherein said polysilicon layer has a thickness in a range of between about 300 and 1000 Å.

18. The method of claim 12 wherein said polysilicon layer has a n-type impurity ion concentration in a range of between about 1E18 and 1E19 atoms/$cm^3$ and a p-type impurity ion concentration in a range of between about 1E17 and 1E19 atoms/$cm^3$; said polysilicon layer having sheet resistance in a range of between about 1 M-ohm and 1 G-ohm.

19. The method of claim 12 wherein said first poly-load resistor and said second poly-load resistor are part of an on-chip temperature sensor device fabricated on the same chip for monitoring the temperature of the chip.

20. A method of fabricating a temperature controller by co-implantation of a poly resistor; comprising the steps of:
  a) forming a first insulating layer over a semiconductor structure;
  b) forming a polysilicon layer on said first insulation layer;
  c) patterning said polysilicon layer to form at least a first poly resistor;
  d) implanting both p-type and n-type impurity ions into the entire said first poly resistor;
  e) forming an dielectric layer over said first poly resistor, and said first insulating layer;
  f) annealing said first poly resistor;
  g) forming contact openings through said dielectric layer exposing portions of said first poly resistor; and
  h) forming contacts to said polysilicon layer thereby completely forming said first poly resistor.

* * * * *